(12) United States Patent
Nishikawa

(10) Patent No.: US 12,230,591 B2
(45) Date of Patent: Feb. 18, 2025

(54) INTEGRATED CIRCUIT, FRONT-END MODULE, AND COMMUNICATION APPARATUS

(71) Applicant: Murata Manufacturing Co., Ltd., Nagaokakyo (JP)

(72) Inventor: Hiroshi Nishikawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 18/233,459

(22) Filed: Aug. 14, 2023

(65) Prior Publication Data

US 2023/0387048 A1 Nov. 30, 2023

Related U.S. Application Data

(63) Continuation of application No. 17/586,940, filed on Jan. 28, 2022, now Pat. No. 11,764,172, which is a (Continued)

(30) Foreign Application Priority Data

Dec. 14, 2016 (JP) .................................. 2016-242702

(51) Int. Cl.
*H03F 3/14* (2006.01)
*H01L 23/66* (2006.01)
(Continued)

(52) U.S. Cl.
CPC .............. *H01L 23/66* (2013.01); *H01L 25/00* (2013.01); *H01P 1/15* (2013.01); *H04B 1/40* (2013.01);
(Continued)

(58) Field of Classification Search
None
See application file for complete search history.

(56) References Cited

U.S. PATENT DOCUMENTS

| 7,245,884 | B2 * | 7/2007 | Oida | H05K 1/16 455/90.3 |
| 7,569,925 | B2 * | 8/2009 | Nishizawa | H01L 23/24 257/703 |
| 7,741,710 | B2 * | 6/2010 | Ichitsubo | H01L 25/18 330/144 |
| 7,804,365 | B2 * | 9/2010 | Korden | H03F 1/0261 330/307 |

(Continued)

OTHER PUBLICATIONS

Nishikawa, "Integrated Circuit, Front-End Module, and Communication Apparatus", U.S. Appl. No. 17/586,940, filed Jan. 28, 2022.

*Primary Examiner* — Tuan A Tran
(74) *Attorney, Agent, or Firm* — Keating & Bennett, LLP

(57) ABSTRACT

An integrated circuit (IC) includes a first switch, a second switch, and an amplifier electrically connected between the first switch and the second switch. An RF signal path passes through first switch, the amplifier, and the second switch in this order. The IC includes an input terminal and an output terminal that are to be connected to each other between the first switch and the amplifier or between the amplifier and the second switch outside of the IC with a component connected therebetween. In a top view of the IC, a first region of the first switch, a second region of the amplifier, and a third region of the second switch are disposed on a straight line such that a virtual straight line connects any point of the first region, any point of the second region, and any point of the second region in this order.

20 Claims, 7 Drawing Sheets

Related U.S. Application Data continuation of application No. 16/357,436, filed on Mar. 19, 2019, now Pat. No. 11,270,961, which is a continuation of application No. PCT/JP2017/043862, filed on Dec. 6, 2017.

(51) Int. Cl.
| | | |
|---|---|---|
| *H01L 25/00* | (2006.01) | |
| *H01P 1/15* | (2006.01) | |
| *H03F 1/56* | (2006.01) | |
| *H03F 3/191* | (2006.01) | |
| *H03G 3/20* | (2006.01) | |
| *H03G 5/16* | (2006.01) | |
| *H04B 1/40* | (2015.01) | |
| *H01L 25/16* | (2023.01) | |

(52) U.S. Cl.
CPC ...... *H01L 25/16* (2013.01); *H01L 2223/6644* (2013.01); *H01L 2223/6661* (2013.01)

(56) References Cited

U.S. PATENT DOCUMENTS

| | | | | |
|---|---|---|---|---|
| 7,885,613 | B2* | 2/2011 | Kemmochi | H04B 1/006 455/78 |
| 8,036,148 | B2* | 10/2011 | Fukamachi | H04B 1/44 370/282 |
| 8,536,957 | B1* | 9/2013 | Nakamura | H05K 1/0216 333/132 |
| 8,831,535 | B2* | 9/2014 | Uejima | H04B 1/006 340/572.1 |
| 9,166,765 | B2* | 10/2015 | Nakamura | H01L 23/3735 |
| 9,337,775 | B1* | 5/2016 | Ilkov | H03F 1/0261 |
| 9,647,707 | B1* | 5/2017 | Kan | H04B 1/1036 |
| 9,722,548 | B2* | 8/2017 | Oshita | H03F 3/72 |
| 9,743,519 | B2* | 8/2017 | Takai | H01L 23/13 |
| 9,985,586 | B2* | 5/2018 | Kim | H04B 1/38 |
| 2004/0232982 | A1* | 11/2004 | Ichitsubo | H01L 24/49 330/129 |
| 2010/0325876 | A1* | 12/2010 | Danno | H01L 23/49827 29/599 |

\* cited by examiner

INTEGRATED CIRCUIT, FRONT-END MODULE, AND COMMUNICATION APPARATUS

CROSS REFERENCE TO RELATED APPLICATIONS

This application claims the benefit of priority to Japanese Patent Application No. 2016-242702 filed on Dec. 14, 2016 and is a Continuation Applications of U.S. application Ser. No. 17/586,940 filed on Jan. 28, 2022, which is a Continuation application of U.S. application Ser. No. 16/357,436 filed on Mar. 19, 2019, which is a Continuation application of PCT Application No. PCT/JP2017/043862 filed on Dec. 6, 2017. The entire contents of each of these applications are hereby incorporated herein by reference.

BACKGROUND OF THE INVENTION

1. Field of the Invention

The present invention relates to an integrated circuit (IC), a front-end module, and a communication apparatus.

2. Description of the Related Art

In recent years, components mounted on a front-end module are more and more highly integrated in order to reduce the size of mobile communication devices and the like. For example, a semiconductor device in which an amplifier circuit, a control circuit, and a switch are integrated on the same semiconductor substrate has been disclosed (for example, see Japanese Unexamined Patent Application Publication No. 10-79467).

A front-module has also been demanded to be compatible with a plurality of frequencies and a plurality of wireless systems (multi-bands and multi-modes) using one terminal. A front-end module compatible with multi-bands and multi-modes is demanded to process a plurality of radio-frequency (RF) signals without deteriorating the quality. For example, improvement of isolation characteristics between paths through which the plurality of RF signals are propagated, and suppression of a path loss are demanded. However, due to the high integration of components, the routing of wiring lines for connecting the components in the substrate becomes complicated, which makes it difficult to improve the isolation characteristics or which results in an increase in path loss due to an increase in the length of the wiring lines.

SUMMARY OF THE INVENTION

Preferred embodiments of the present invention provide integrated circuits (ICs), front-end modules, and communication apparatuses that are each capable of reducing or preventing a path loss while improving isolation characteristics.

An integrated circuit (IC) according to a preferred embodiment of the present invention includes a first switch, a second switch, and an amplifier electrically connected between the first switch and the second switch. An RF signal path passes through first switch, the amplifier, and the second switch in this order. The IC includes at least one input terminal and at least one output terminal that are to be connected to each other between the first switch and the amplifier or between the amplifier and the second switch outside of the IC with a component disposed outside of the IC and connected therebetween. In a top view of the IC, a first region of the first switch, a second region of the amplifier, and a third region of the second switch are disposed on a straight line such that a virtual straight line connects any point of the first region, any point of the second region, and any point of the second region in this order.

In an IC according to a preferred embodiment of the present invention, in the top view of the IC, the second region is between or substantially between the first region and the third region.

In an IC according to a preferred embodiment of the present invention, in the top view of the IC, the first switch and the amplifier, or the amplifier and the second switch, are disposed next to each other.

In an IC according to a preferred embodiment of the present invention, in the top view of the IC, the amplifier and the second switch are disposed next to each other.

In an IC according to a preferred embodiment of the present invention, the amplifier is a low-noise amplifier, the at least one input terminal and the at least one output terminal that are to be connected to each other outside of the IC provides a connection between the first switch and the amplifier outside of the IC, and the component to be connected between the first switch and the amplifier is a reception filter.

In an IC according to a preferred embodiment of the present invention, in the top view of the IC, the IC has a rectangular or substantially rectangular shape and the virtual straight line is parallel or substantially parallel to a side of the rectangular or substantially rectangular shape.

A front-end module according to a preferred embodiment of the present invention includes a first switch, a second switch, an amplifier electrically connected between the first switch and the second switch, a component connected between the first switch and the amplifier or between the amplifier and the second switch, and a substrate. The first switch, the amplifier, and the second switch are included in an integrated circuit. The integrated circuit is disposed on the substrate. The component is disposed on the substrate and outside of the integrated circuit. An RF signal path passes through the first switch, the amplifier, and the second switch in this order. In a top view of the integrated circuit, a first region of the first switch, a second region of the amplifier, and a third region of the second switch are disposed on a straight line such that a virtual straight line connects any point of the first region, any point of the second region, and any point of the second region in this order.

In a front-end module according to a preferred embodiment of the present invention, in the top view of the integrated circuit, the second region is between or substantially between the first region and the third region.

In a front-end module according to a preferred embodiment of the present invention, in the top view of the integrated circuit, the first switch and the amplifier, or the amplifier and the second switch, are disposed next to each other.

In a front-end module according to a preferred embodiment of the present invention, in the top view of the integrated circuit, the amplifier and the second switch are disposed next to each other.

In a front-end module according to a preferred embodiment of the present invention, the amplifier is a low-noise amplifier, the component is a reception filter, and the component is connected between the first switch and the amplifier.

In a front-end module according to a preferred embodiment of the present invention, in the top view of the integrated circuit, the integrated circuit has a rectangular or substantially rectangular shape and the virtual straight line is parallel or substantially parallel to a side of the rectangular or substantially rectangular shape.

In addition, a communication apparatus according to a preferred embodiment of the present invention includes an RF signal processing circuit that processes a radio frequency signal transmitted and received by an antenna element, and a front-end module according to a preferred embodiment of the present invention transferring the radio frequency signal between the antenna element and the RF signal processing circuit.

Accordingly, a communication apparatus capable of reducing or preventing a path loss while improving isolation characteristics is able to be provided.

According to the ICs, the front-end modules, and the communication apparatuses according to preferred embodiments of the present invention, a path loss is able to be reduced or prevented while improving isolation characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
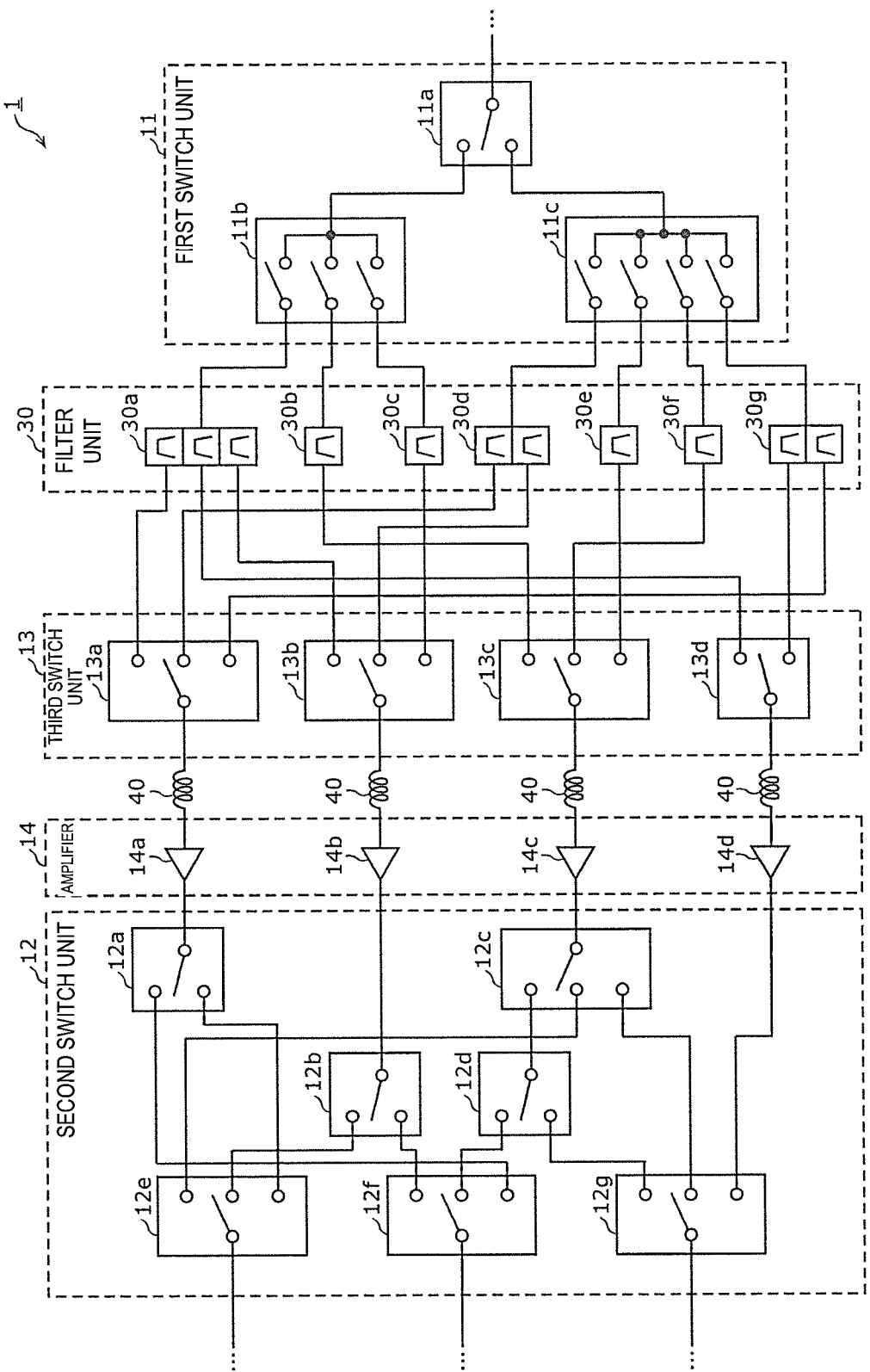
FIG. 1 is a circuit configuration diagram of a front-end module according to a first preferred embodiment of the present invention.

Hereinafter, preferred embodiments of the present invention will be described in detail with reference to examples and the accompanying drawings. Note that all of the preferred embodiments described below illustrate comprehensive or specific examples. Numerals, shapes, materials, elements, and the arrangement and connection structure of the elements described in the following preferred embodiments are only exemplary and are not construed to limit the present invention. Among the elements in the following preferred embodiments, elements that are not described in independent claims are described as arbitrary or optional elements. In addition, the sizes of elements illustrated in the drawings are not necessarily precise. In addition, the same or substantially the same configurations are denoted by the same reference numeral in the drawings, and overlapping descriptions may be omitted or simplified.

First Preferred Embodiment

FIG. 1 is a circuit configuration diagram of a front-end module 1 according to a first preferred embodiment of the present invention.

The front-end module 1 is disposed in, for example, a front-end portion of a cellular phone compatible with multi-modes/multi-bands. The front-end module 1 is preferably included in, for example, a multi-band-compatible cellular phone that conforms to a communication standard such as LTE (Long Term Evolution) or other suitable communication standard. The front-end module 1 includes a plurality of paths (RF paths) through which a plurality of RF signals having different frequency bands are propagated.

As illustrated in FIG. 1, the front-end module 1 includes a first switch unit 11, a second switch unit 12, a third switch unit 13, an amplifier 14, a filter unit 30, and matching circuits (here, inductors 40). The first switch unit 11, the second switch unit 12, the third switch unit 13, and the amplifier 14 define a switch IC 10, which will be described in detail below. The plurality of RF paths pass through the switch IC 10, the filter unit 30, and the inductors 40, and RF signals flow in the order of the first switch unit 11, the third switch unit 13, the amplifier 14, and the second switch unit 12. Specifically, the plurality of RF paths pass in the order of the first switch unit 11, the filter unit 30, the third switch unit 13, the inductors 40, the amplifier 14, and the second switch unit 12.

The first switch unit 11 includes an input terminal connected to, for example, an antenna element. In addition, output terminals of the first switch unit 11 and input terminals of the filter unit 30 are connected to each other. The first switch unit 11 includes switches 11a to 11c, which separate an RF signal received by the antenna terminal to RF paths respectively for filters 30a to 30g included in the filter unit 30.

The filter unit 30 includes the filters 30a to 30g, which include surface acoustic wave (SAW: Surface Acoustic Wave) resonators, bulk elastic wave (BAW: Bulk Acoustic Wave) resonators, FBAR (Film Bulk Acoustic Resonators), or other suitable resonators. Note that the filters 30a to 30g may include LC resonance circuits, for example. Here, the filters 30a to 30g are preferably SAW resonators, for example. Accordingly, because the filters 30a to 30g are defined by IDT (InterDigital Transducer) electrodes provided on a substrate with piezoelectricity, the filter unit 30 is small, has a low height, and has bandpass characteristics with high steepness. Output terminals of the filter unit 30 and input terminals of the second switch unit 12 are connected to each other.

Note that the substrate with piezoelectricity preferably at least has piezoelectricity on its surface. For example, the substrate may be defined by a multilayer body including a piezoelectric thin film on a surface thereof, a film with a different acoustic velocity from the piezoelectric thin film, and a supporting substrate. The substrate may preferably be, for example, a multilayer body including a high-acoustic-velocity supporting substrate and a piezoelectric thin film provided on the high-acoustic-velocity supporting substrate;

a multilayer body including a high-acoustic-velocity supporting substrate, a low-acoustic-velocity film provided on the high-acoustic-velocity supporting substrate, and a piezoelectric thin film provided on the low-acoustic-velocity film; or a multilayer body including a supporting substrate, a high-acoustic-velocity film provided on the supporting substrate, a low-acoustic-velocity film provided on the high-acoustic-velocity film, and a piezoelectric thin film provided on the low-acoustic-velocity film. Alternatively, the entire substrate may have piezoelectricity.

The filter 30a is preferably, for example, a triplexer including three filters with a common input terminal. In addition, the filters 30d and 30g are preferably, for example, duplexers each including two filters with a common input terminal.

The third switch unit 13 includes switches 13a to 13d, each of which provide RF paths for a corresponding one of the filters 30a to 30g. Output terminals of the third switch unit 13 and input terminals of the amplifier 14 are connected to each other. Specifically, the output terminals of the third switch unit 13 and the input terminals of the amplifier 14 are connected to each other with the inductors 40 interposed therebetween.

The inductors 40 are matching circuits to match the third switch unit 13 and the amplifier 14, and are connected between the third switch unit 13 and the amplifier 14. Note that the matching circuits are not restricted to the inductors 40, and may be circuits that each include a capacitor or a combination of an inductor and a capacitor.

The amplifier 14 includes amplifier circuits 14a to 14d, which amplify RF signals propagating through the RF paths provided by the switches 13a to 13d. The amplifier circuits 14a to 14d are preferably, for example, low-noise amplifiers that amplify RF reception signals. Output terminals of the amplifier 14 and the input terminals of the second switch unit 12 are connected to each other. Note that the amplifier circuits 14a to 14d are not restricted to low-noise amplifiers, and may be, for example, power amplifiers that amplify RF transmission signals. In the case in which the amplifier circuits 14a to 14d are power amplifiers, RF signals flow in the order of the second switch unit 12, the amplifier 14, the third switch unit 13, and the first switch unit 11.

The second switch unit 12 includes output terminals connected to, for example, an RF signal processing circuit (RFIC). The second switch unit 12 includes switches 12a to 12g, which distribute RF signals amplified by the amplifier 14 to terminals of the RFIC.

Using a controller (not illustrated) included in the front-end module 1, connections of the switches 11a to 11c included in the first switch unit 11, the switches 12a to 12g included in the second switch unit 12, and the switches 13a to 13d included in the third switch unit 13 are switched.

The switches 11a to 11c, 12a to 12d, and 13a to 13g are preferably, for example, FET (Field Effect Transistor) switches made of GaAs or CMOS (Complementary Metal Oxide Semiconductor), or diode switches.

Next, the layout of the elements of the switch IC 10 and the configuration on a first main side of the front-end module 1 will be described using FIG. 2A.

Figure 2A:
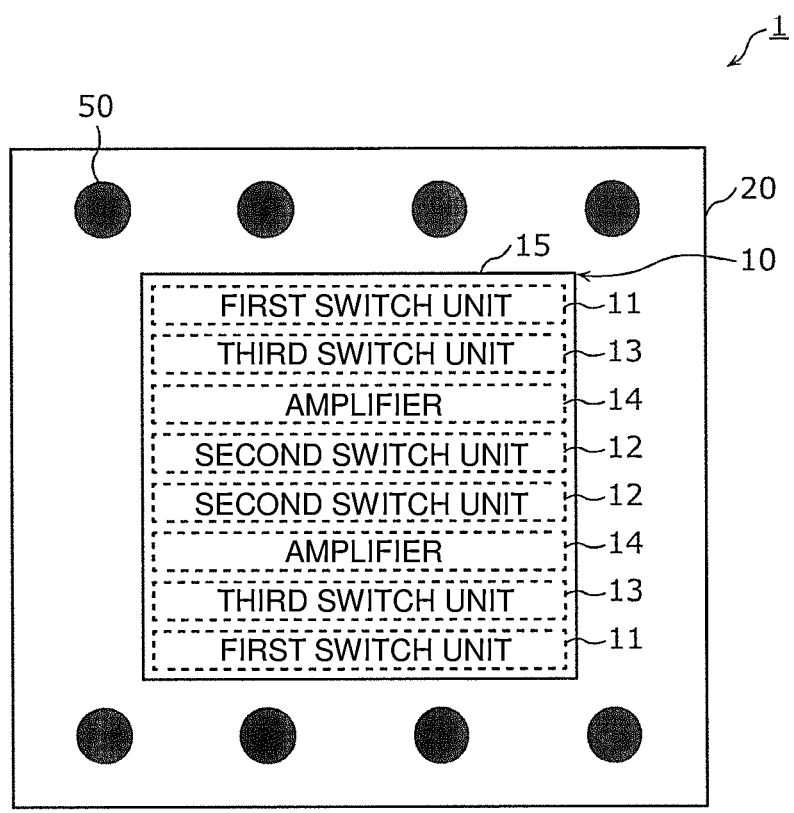
FIG. 2A is a plan view of the front-end module according to the first preferred embodiment of the present invention, viewed from a first main side.

FIG. 2A is a plan view of the front-end module 1 according to the first preferred embodiment, viewed from the first main side. The first main side is, for example, the back surface of a substrate 20 included in the front-end module 1. The switch IC 10 and electrodes 50 are provided on the back surface of the substrate 20. Note that the electrodes 50 may preferably be, for example, copper pillars (copper pins), plating, copper paste, solder, or other suitable electrodes. The substrate 20 is preferably, for example, a printed circuit board or an LTCC (Low Temperature Co-fired Ceramics) substrate. Note that the switch IC 10 is resin-sealed, but the resin is not illustrated in FIG. 2A.

In the present preferred embodiment, an RF signal flows in the order of the first switch unit 11, the third switch unit 13, the amplifier 14, and the second switch unit 12. As illustrated in FIG. 2A, the first switch unit 11, the second switch unit 12, the third switch unit 13, and the amplifier 14 are disposed on a straight line in the order in which a signal (RF signal) passes through the first switch unit 11, the second switch unit 12, the third switch unit 13, and the amplifier 14. The order in which a signal passes through the first switch unit 11, the second switch unit 12, the third switch unit 13, and the amplifier 14 is, in the present preferred embodiment, the order of the first switch unit 11, the third switch unit 13, the amplifier 14, and the second switch unit 12. Specifically, the first switch unit 11 and the third switch unit 13 are disposed next to each other; the third switch unit 13 and the amplifier 14 are disposed next to each other; and the amplifier 14 and the second switch unit 12 are disposed next to each other. Each of the above-described combinations is disposed on a straight line. More specifically, the switch IC 10 includes a base 15. In a top view of the base 15, the first switch unit 11, the second switch unit 12, the third switch unit 13, and the amplifier 14 are provided in the order of the first switch unit 11, the third switch unit 13, the amplifier 14, and the second switch unit 12 from one end towards the center of the base 15. The base 15 is preferably made of, for example, silicon. Although the first switch unit 11, the second switch unit 12, the third switch unit 13, and the amplifier 14 are, for example, included in the base 15, they may be disposed on the surface of the base 15. Being disposed on a straight line includes not only the case in which elements are disposed on a virtual straight line when this virtual straight line is drawn, but also the case in which elements are disposed near the virtual straight line. Alternatively, the first switch unit 11 and the third switch unit 13 may be disposed next to each other with another component interposed therebetween; the second switch unit 12 and the amplifier 14 may be disposed next to each other with another component interposed therebetween; and the amplifier 14 and the third switch unit 13 may be disposed next to each other with another component interposed therebetween.

Note that the first switch unit 11, the second switch unit 12, the third switch unit 13, and the amplifier 14, such as those illustrated in FIG. 1, may be divided into two groups and these two groups may be disposed on the base 15. In FIG. 2A, one of two groups of the first switch unit 11, the second switch unit 12, the third switch unit 13, and the amplifier 14 is provided from the top end towards the center of the base 15 in FIG. 2A, and the other group of the first switch unit 11, the second switch unit 12, the third switch unit 13, and the amplifier 14 is provided from the bottom end towards the center of the base 15 in FIG. 2A, in the above-described order on a straight line. In this manner, the elements of the switch IC 10 are provided on the base 15 in the layout illustrated in FIG. 2A.

Next, the configuration on a second main side of the front-end module 1 will be described using FIG. 2B.

Figure 2B:
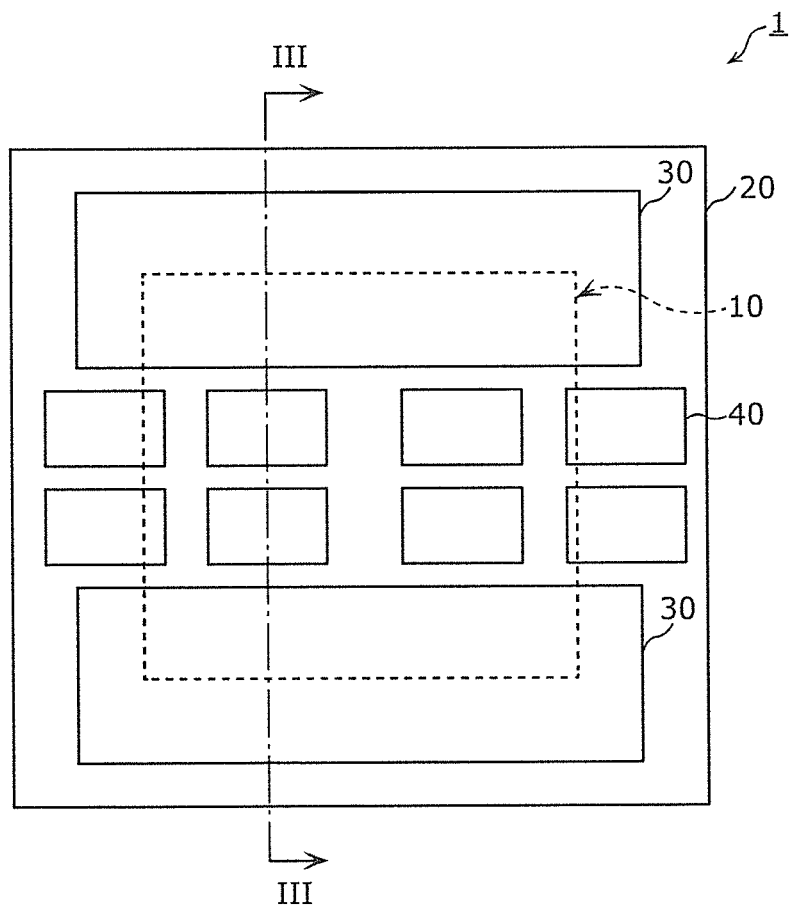
FIG. 2B is a plan view of the front-end module according to the first preferred embodiment of the present invention, viewed from a second main side.

FIG. 2B is a plan view of the front-end module 1 according to the first preferred embodiment, viewed from the second main side. The second main side is, for example, the front surface of the substrate 20. The filter unit 30 and the inductors 40 are provided on the front surface of the substrate 20. Note that the filter unit 30 and the inductors 40 are resin-sealed, but the resin is not illustrated in FIG. 2B. In addition, the switch IC 10 provided on the back surface of the substrate 20 is indicated by a broken line in FIG. 2B.

As illustrated in FIG. 2B, the switch IC 10 overlaps the filter unit 30 in a plan view of the substrate 20. In addition, the switch IC 10 overlaps the inductors 40 in the plan view of the substrate 20. Note that the filter unit 30 such as that illustrated in FIG. 1 may be provided in two separate portions on the base 15, as illustrated in FIG. 2B. In addition, although four inductors 40 are illustrated in FIG. 1, for example, eight inductors 40 may be provided, as illustrated in FIG. 2B, in accordance with the number of bands, for example.

Next, the flow of an RF signal will be described with reference to FIG. 3 by describing one of a plurality of RF paths included in the front-end module 1.

Figure 3:
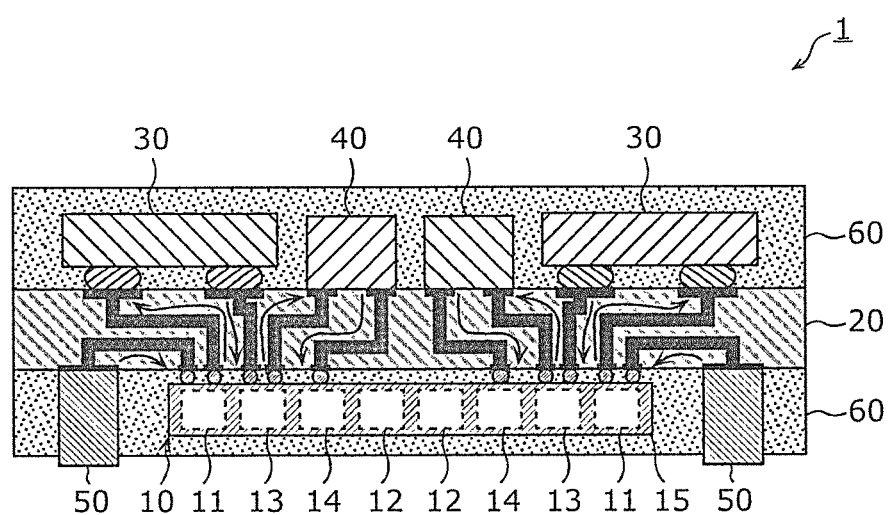
FIG. 3 is a sectional view of the front-end module according to the first preferred embodiment of the present invention.

FIG. 3 is a sectional view of the front-end module 1 according to the first preferred embodiment. Note that FIG. 3 is a sectional view of the front-end module 1 taken along in FIG. 2B.

As illustrated in FIG. 3, the switch IC 10 is sealed by resin 60 on the back surface of the substrate 20, and the filter unit 30 and the inductors 40 are sealed by resin 60 on the front surface of the substrate 20. Note that the resin 60 on the front surface and the resin 60 on the back surface of the substrate 20 may be the same type of resin or different types of resins. In addition, although both sides of the substrate 20 are covered by the resin 60 in FIG. 3, only the switch IC 10, the filter unit 30, or the inductors 40 may be sealed by resin, such as an underfill, for example.

The front-end module 1 is mounted on, for example, a motherboard (not illustrated), and receives an RF signal from the motherboard via the electrodes 50. Arrows illustrated in FIG. 3 indicate the flow of RF signals in the front-end module 1. An RF signal flows to the first switch unit 11 via a wiring line connecting the electrode 50 and the input terminal (bump) of the first switch unit 11. Next, the RF signal that has passed through the first switch unit 11 flows to the filter unit 30 via a wiring line connecting the output terminal (bump) of the first switch unit 11 and the input terminal (bump) of the filter unit 30. Next, the RF signal that has been filtered by the filter unit 30 flows to the third switch unit 13 via a wiring line connecting the output terminal (bump) of the filter unit 30 and the input terminal (bump) of the third switch unit 13. Next, the RF signal that has passed through the third switch unit 13 flows to the inductor 40 via a wiring line connecting the output terminal (bump) of the third switch unit 13 and the input terminal of the inductor 40. Next, the RF signal that has passed through the inductor 40 flows to the amplifier 14 via a wiring line connecting the output terminal of the inductor 40 and the input terminal (bump) of the amplifier 14. Then, the RF signal that has been amplified by the amplifier 14 flows to the second switch unit 12 via a wiring line (not illustrated) connecting the output terminal (not illustrated) of the amplifier 14 and the input terminal (not illustrated) of the second switch unit 12.

Because an RF signal flows from the first switch unit 11 to the filter unit 30 and from the filter unit 30 to the third switch unit 13, a wiring line connecting the first switch unit 11 and the filter unit 30 and a wiring line connecting the filter unit 30 and the third switch unit 13 are necessary. As illustrated in FIGS. 2A and 3, because the first switch unit 11 and the third switch unit 13 are disposed next to each other, the filter unit 30 is able to be disposed near both of the first switch unit 11 and the third switch unit 13. Accordingly, the wiring line connecting the first switch unit 11 and the filter unit 30 and the wiring line connecting the filter unit 30 and the third switch unit 13 is able to be reduced in length.

Similarly, because an RF signal flows from the third switch unit 13 to the inductor 40 and from the inductor 40 to the amplifier 14, a wiring line connecting the third switch unit 13 and the inductor 40 and a wiring line connecting the inductor 40 and the amplifier 14 are necessary. Because the third switch unit 13 and the amplifier 14 are disposed next to each other, the inductor 40 is able to be disposed near both of the third switch unit 13 and the amplifier 14. Accordingly, the wiring line connecting the third switch unit 13 and the inductor 40 and the wiring line connecting the inductor 40 and the amplifier 14 is able to be reduced in length.

In the case in which the amplifier 14 and the second switch unit 12 are connected to each other with another component interposed therebetween, the other component is able to be disposed near both of the amplifier 14 and the second switch unit 12, and a wiring line connecting the amplifier 14 and this other component and a wiring line connecting this other component and the second switch unit 12 is able to be reduced in length.

In addition, as illustrated in FIGS. 2B and 3, the switch IC 10 is provided on, regarding the substrate 20 with one of two main sides (second main side: front surface) on which the filter unit 30 is provided, the other main side (first main side: back surface) of the substrate 20 so as to overlap the filter unit 30 in a plan view of the substrate 20. For example, in the case in which the switch IC 10 and the filter unit 30 are provided on the same side, it is at least necessary to extract a wiring line from a terminal of the switch IC 10 to the component outer diameter of the filter unit 30. By providing a wiring line connecting the switch IC 10 and the filter unit 30 in the thickness direction of the substrate 20, the length of the wiring line is able to be reduced to about the thickness (such as about 0.2 mm to about 0.3 mm, for example) of the substrate 20 at the minimum.

In addition, for example, in the case in which the switch IC 10 and the filter unit 30 are provided on the same side of the substrate 20, a wiring line connecting the switch IC 10 and the filter unit 30 is routed in a direction parallel or substantially parallel to the main sides of the substrate 20 (routed two-dimensionally). In this case, it is difficult to route wiring lines connecting the switches (such as the switches 11b, 11c, and 12a to 12d) included in the switch IC 10 and the filters 30a to 30g included in the filter unit 30 on the same layer of the substrate 20, and these wiring lines are routed two-dimensionally on different layers, which makes it easier for these wiring lines to overlap one another in a plan view of the substrate 20. In contrast, in the present preferred embodiment, because the switch IC 10 overlaps the filter unit 30 in a plan view of the substrate 20 wiring lines connecting the switch IC 10 and the filter unit 30 are connected three-dimensionally in the thickness direction of the substrate 20, which prevents these wiring lines from overlapping one another in a plan view of the substrate 20.

FIG. 3 schematically illustrates the wiring lines on the same cross-section in order to describe the flow of an RF signal. For example, a wiring line connecting the electrode 50 and the input terminal of the first switch unit 11 and a wiring line connecting the output terminal of the first switch unit 11 and the input terminal of the filter unit 30 overlap each other in a plan view of the substrate 20. However, for example, by disposing the input terminal and the output terminal of the first switch unit 11 so as not to be positioned on the same cross-section, these wiring lines are prevented from overlapping each other in a plan view of the substrate 20. In this manner, a wiring line connecting the input terminal or the output terminal of the filter unit 30 and one or more wiring lines other than this wiring line in the front-end module 1 are prevented from overlapping each other in a top view of the substrate 20. Similarly, a wiring line connecting the input terminal or the output terminal of the inductor 40 and one or more wiring lines other than this wiring line in the front-end module 1 are prevented from overlapping each other in a top view of the substrate 20.

Figure 4:
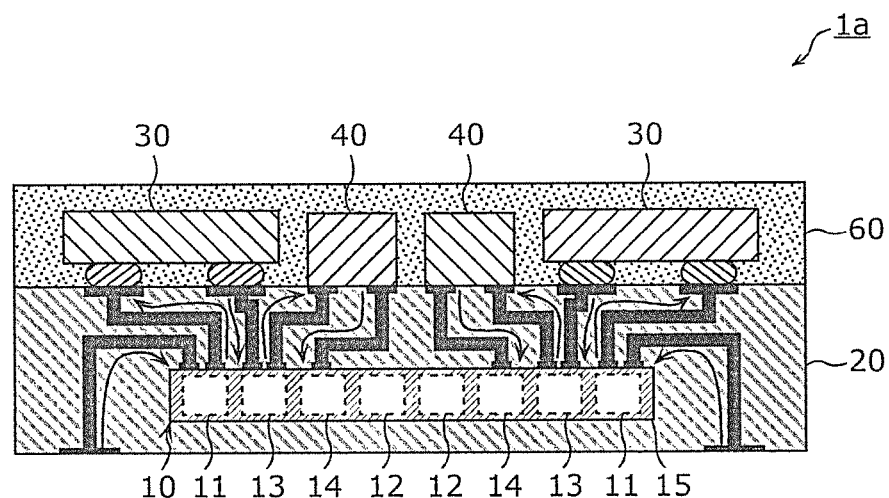
FIG. 4 is a sectional view of a front-end module according to a modification of the first preferred embodiment of the present invention.

Although the switch IC 10 is provided on one of two main sides (such as the back surface) of the substrate 20, the switch IC 10 may be provided inside the substrate 20, as illustrated in FIG. 4. FIG. 4 is a sectional view of a front-end module 1a according to a modification of the first preferred embodiment.

In the case in which the switch IC 10 is included in the substrate 20, the substrate 20 may preferably be a printed circuit board, for example, in which processing to include the switch IC 10 in the substrate 20 is easy. Because the functions of the front-end module 1a are the same or substantially the same as the front-end module 1, descriptions thereof are omitted.

In order to be compatible with multi-bands, a plurality of RF paths through which a plurality of RF signals with different frequency bands are propagated pass through a switch IC. Each of the RF signals reciprocates between the switch IC and another component (such as a filter unit) connected to the switch IC. For each RF path, a wiring line through which an RF signal reciprocates between the switch IC and this other component is provided. Therefore, as the number of frequencies handled by one terminal increases, the number of RF paths increases, which makes it more complicated to route wiring lines for the individual RF paths. For example, as wiring lines for the individual RF paths overlap one another in a plan view of a substrate, the degree of coupling between the wiring lines becomes higher (that is, isolation characteristics are deteriorated). The longer the wiring lines are, the greater the path loss becomes.

To this end, in the switch IC 10 and the front-end module 1 according to the first preferred embodiment, the first switch unit 11, the second switch unit 12, the third switch unit 13, and the amplifier 14 are disposed on a straight line along the flow of a signal (RF signal) in the switch IC 10. For example, it is assumed that a signal flows in the order of the first switch unit 11, the third switch unit 13, the amplifier 14, and the second switch unit 12. Accordingly, in the case in which the first switch unit 11 and the third switch unit 13 are connected to each other with another component (filter unit 30) interposed therebetween, a wiring line connecting the first switch unit 11 and the third switch unit 13 with the filter unit 30 interposed therebetween is reduced in length, thus reducing or preventing a path loss. Similarly, in the case in which the third switch unit 13 and the amplifier 14 are connected to each other with another component (such as the inductor 40) interposed therebetween, a wiring line connecting the third switch unit 13 and the amplifier 14 with another component interposed therebetween is reduced in length, thus reducing or preventing a path loss. Similarly, in the case in which the amplifier 14 and the second switch unit 12 are connected to each other with another component interposed therebetween, a wiring line connecting the amplifier 14 and the second switch unit 12 with another component interposed therebetween is reduced in length, thus reducing or preventing a path loss. Since these wiring lines are reduced in length, the routing of the wiring lines is simplified, and it becomes easier to design the wiring lines for the individual RF paths so as not to overlap one another in a plan view of the substrate 20, thus improving the isolation characteristics.

In addition, because the switch IC 10 overlaps the filter unit 30 in a plan view of the substrate 20 and it becomes easier to design the wiring lines for the individual RF paths between the switch IC 10 and the filter unit 30 so as not to overlap one another in a plan view of the substrate 20, the isolation characteristics are able to be improved. This is because the wiring lines are provided three-dimensionally in the thickness direction of the substrate 20, and it becomes more difficult for these wiring lines to be coupled to each other. In this manner, a path loss is able to be reduced or prevented while improving isolation characteristics.

In addition, the layout of the first switch unit 11, the second switch unit 12, the third switch unit 13, and the amplifier 14 on the base 15 is such that an RF signal flows from one end towards the center of the base 15.

In addition, because a wiring line connecting the input terminal or the output terminal of the filter unit 30 and one or more wiring lines other than this wiring line in the front-end module 1 do not overlap each other in a top view of the substrate 20, the isolation characteristics are able to be further improved.

Second Preferred Embodiment

In a second preferred embodiment of the present invention, in a top view of the base 15, the first switch unit 11, the second switch unit 12, the third switch unit 13, and the amplifier 14 are provided on the base 15 in the order of the first switch unit 11, the third switch unit 13, the amplifier 14, and the second switch unit 12 from the center towards one end of the base 15.

Figure 5:
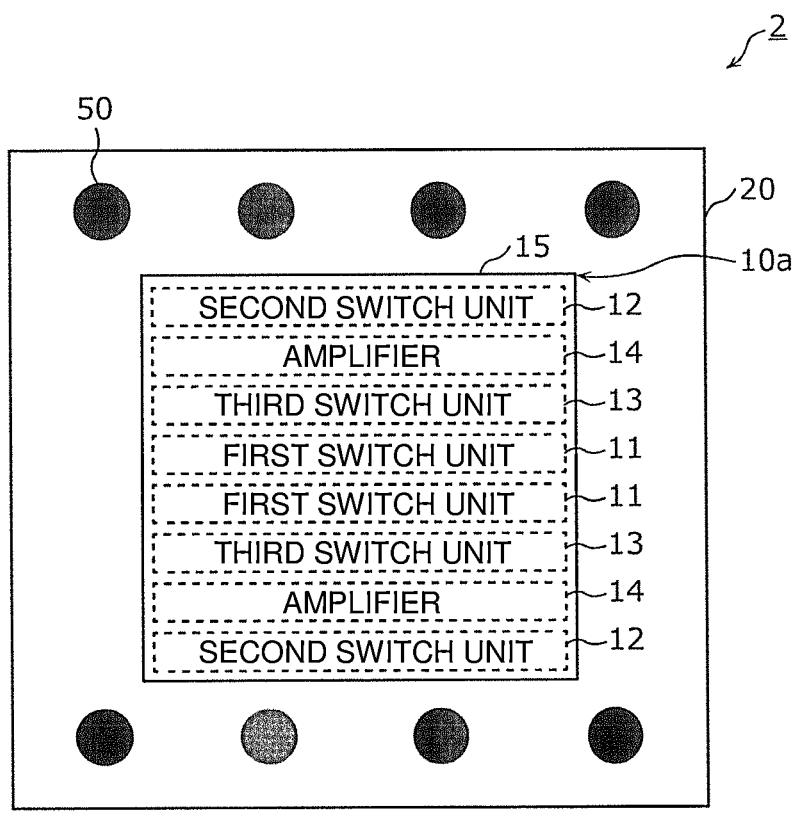
FIG. 5 is a plan view of a front-end module according to a second preferred embodiment of the present invention, viewed from the first main side.

FIG. 5 is a plan view of a front-end module 2 according to the second preferred embodiment, viewed from the first main side. Here, the first main side is, for example, the back surface of the substrate 20 included in the front-end module 2. A switch IC 10a and the electrodes 50 are provided on the back surface of the substrate 20.

The switch IC 10a includes the base 15. In top view of the base 15, the first switch unit 11, the second switch unit 12, the third switch unit 13, and the amplifier 14 are provided on the base 15 in the order of the first switch unit 11, the third switch unit 13, the amplifier 14, and the second switch unit 12 from the center of the base 15 towards one end of the base 15. The first switch unit 11, the second switch unit 12, the third switch unit 13, and the amplifier 14, such as those illustrated in FIG. 1, may be divided into two groups and these two groups may be disposed on the base 15. In FIG. 5, one of two groups of the first switch unit 11, the second switch unit 12, the third switch unit 13, and the amplifier 14 is provided from the center towards the top end of the base 15 in FIG. 5, and the other group of the first switch unit 11, the second switch unit 12, the third switch unit 13, and the amplifier 14 is provided from the center towards the bottom end of the base 15 in FIG. 5, in the above-described order on a straight line on the base 15. In this manner, the elements of the switch IC 10a are provided on the base 15 in the layout illustrated in FIG. 5.

Accordingly, the layout of the first switch unit 11, the second switch unit 12, the third switch unit 13, and the amplifier 14 on the base 15 is such that an RF signal flows from the center to one end of the base 15.

Third Preferred Embodiment

In a third preferred embodiment of the present invention, in a top view of the base 15, the first switch unit 11, the second switch unit 12, the third switch unit 13, and the amplifier 14 are provided on the base 15 in the order of the first switch unit 11, the third switch unit 13, the amplifier 14, and the second switch unit 12 from one end to another end opposing the one end of the base 15.

Figure 6:
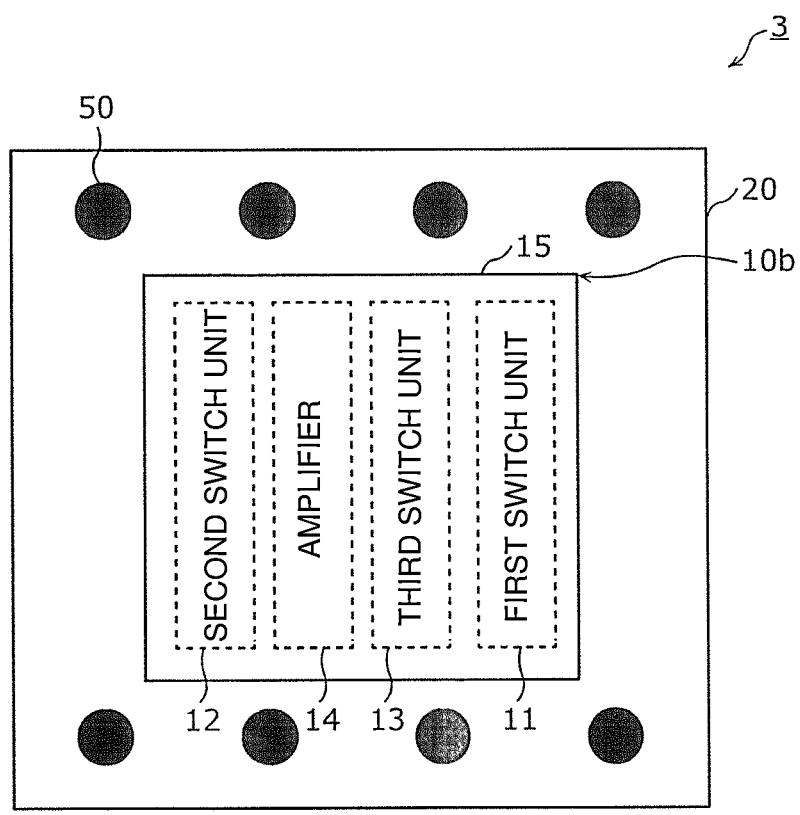
FIG. 6 is a plan view of a front-end module according to a third preferred embodiment of the present invention, viewed from the first main side.

FIG. 6 is a plan view of a front-end module 3 according to the third preferred embodiment, viewed from the first main side. Here, the first main side is, for example, the back surface of the substrate 20 included in the front-end module 3. A switch IC 10b and the electrodes 50 are provided on the back surface of the substrate 20.

The switch IC 10b includes the base 15. In a top view of the base 15, the first switch unit 11, the second switch unit 12, the third switch unit 13, and the amplifier 14 are provided on the base 15 in the order of the first switch unit 11, the third switch unit 13, the amplifier 14, and the second switch unit 12 from one end to another end opposing the one end of the base 15. As illustrated in FIG. 6, the first switch unit 11, the second switch unit 12, the third switch unit 13, and the amplifier 14 are provided in the above order on a straight line on the base 15 from one end on the right side to the other end on the left side of the base 15 in FIG. 6. In this manner, the elements of the switch IC are provided on the base 15 in the layout illustrated in FIG. 6.

Accordingly, the layout of the first switch unit 11, the second switch unit 12, the third switch unit 13, and the amplifier 14 on the base 15 is such that an RF signal flows from one end to another end opposing the one end of the base 15.

Fourth Preferred Embodiment

Although the switch ICs 10, 10a, and 10b include the third switch unit 13 in the above-described preferred embodiments, the switch ICs 10, 10a, and 10b need not include the third switch unit 13.

Figure 7:
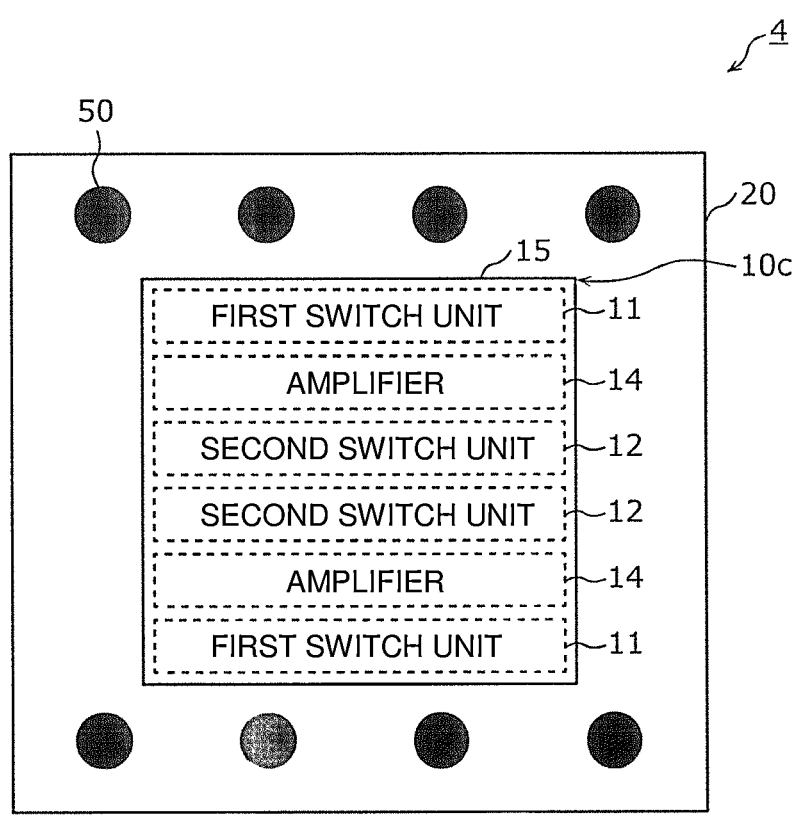
FIG. 7 is a plan view of a front-end module according to a fourth preferred embodiment of the present invention, viewed from the first main side.

FIG. 7 is a plan view of a front-end module 4 according to a fourth preferred embodiment of the present invention, viewed from the first main side. Here, the first main side is, for example, the back surface of the substrate 20 included in the front-end module 4. A switch IC 10c and the electrodes 50 are provided on the back surface of the substrate 20.

In the present preferred embodiment, an RF signal flows in the order of the first switch unit 11, the amplifier 14, and the second switch unit 12. As illustrated in FIG. 7, the first switch unit 11, the second switch unit 12, and the amplifier 14 are disposed on a straight line in the order in which an RF signal passes through the first switch unit 11, the second switch unit 12, and the amplifier 14. The order in which a signal passes through the first switch unit 11, the second switch unit 12, and the amplifier 14 is, in the present preferred embodiment, the order of the first switch unit 11, the amplifier 14, and the second switch unit 12. Specifically, the first switch unit 11 and the amplifier 14 are disposed next to each other, and the amplifier 14 and the second switch unit 12 are disposed next to each other. Each of the above combinations is disposed on a straight line. More specifically, the switch IC 10c includes the base 15. In a top view of the base 15, the first switch unit 11, the second switch unit 12, and the amplifier 14 are provided in the order of the first switch unit 11, the amplifier 14, and the second switch unit 12 from one end towards the center of the base 15. Alternatively, in top view of the base 15, the first switch unit 11, the second switch unit 12, and the amplifier 14 may be provided in the order of the first switch unit 11, the amplifier 14, and the second switch unit 12 from the center towards one end of the base 15 or from one end to another end opposing the one end of the base 15. In addition, the first switch unit 11 and the amplifier 14 may be disposed next to each other with another component interposed therebetween, and the amplifier 14 and the second switch unit 12 may be disposed next to each other with another component interposed therebetween.

Accordingly, in the switch IC 10c, the first switch unit 11, the second switch unit 12, and the amplifier 14 are disposed on a straight line along the flow of a signal (RF signal) in the switch IC 10c. For example, it is assumed that a signal flows in the order of the first switch unit 11, the amplifier 14, and the second switch unit 12. Accordingly, in the case in which the first switch unit 11 and the amplifier 14 are connected to each other with another component (such as the filter unit 30) interposed therebetween, a wiring line connecting the first switch unit 11 and the amplifier 14 with another component interposed therebetween is reduced in length, thus reducing or preventing a path loss. Similarly, in the case in which the amplifier 14 and the second switch unit 12 are connected to each other with another component (such as the inductor 40) interposed therebetween, a wiring line connecting the amplifier 14 and the second switch unit 12 with another component interposed therebetween is reduced in length, thus reducing or preventing a path loss. Since these wiring lines are reduced in length, the routing of the wiring lines is simplified, and it becomes easier to design the wiring lines for the individual RF paths so as not to overlap one another in a plan view of the substrate 20, thus improving the isolation characteristics.

Fifth Preferred Embodiment

The switch IC 10 and the front-end module 1 described in the first preferred embodiment are applicable to a communication apparatus.

Figure 8:
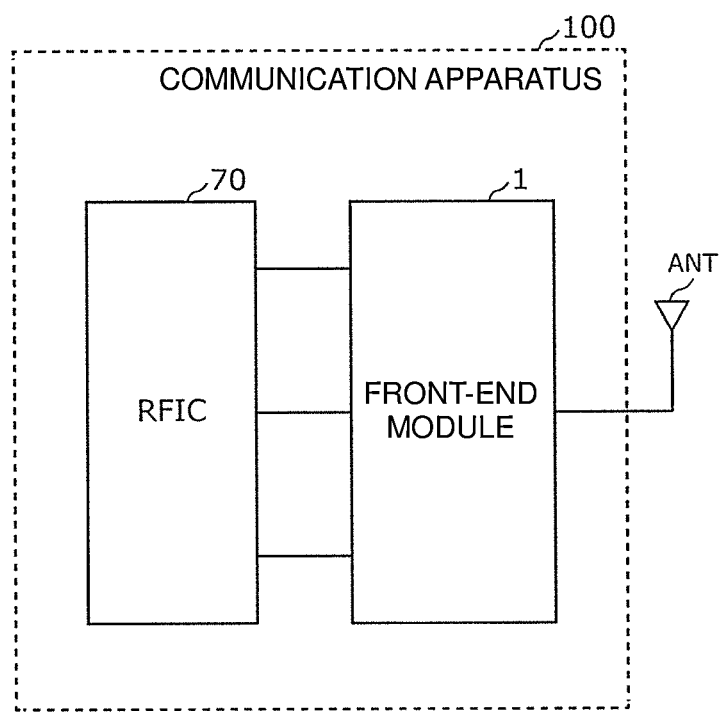
FIG. 8 is a configuration diagram of a communication apparatus according to a fifth preferred embodiment of the present invention.

FIG. 8 is a configuration diagram of a communication apparatus 100 according to a fifth preferred embodiment of the present invention. FIG. 8 illustrates the front-end module 1, an antenna element ANT, and an RF signal processing circuit (RFIC) 70. The front-end module 1 and the RFIC 70 define the communication apparatus 100. The antenna element ANT, the front-end module 1, and the RFIC 70 are preferably disposed in, for example, a front-end portion or a cellular phone compatible with multi-modes/multi-bands.

The antenna element ANT is preferably a multi-band-compatible antenna that conforms to a communication standard, such as LTE, for example, and the antenna element ANT transmits and receives RF signals. The antenna element ANT may be included in the communication apparatus 100.

The front-end module 1 transfers an RF signal between the antenna element ANT and the RFIC 70. Specifically, the front-end module 1 transfers an RF signal received by the antenna element ANT to the RFIC 70 via a reception-side signal path.

The RFIC 70 is an RF signal processing circuit that processes an RF signal transmitted and received by the antenna element ANT. Specifically, the RFIC 70 performs signal processing on an RF signal input from the antenna element ANT via a reception-side signal path of the front-end module 1 by, for example, down-converting the RF signal, and outputs a reception signal generated by the signal processing to a baseband signal processing circuit (not illustrated).

Because the communication apparatus 100 includes the front-end module 1 (switch IC 10), the communication apparatus 100 is capable of reducing or preventing a path loss while improving isolation characteristics.

Although the communication apparatus 100 includes the front-end module 1, the communication apparatus 100 may include the front-end module 1a, 2, 3, or 4.

Although the switch IC, the front-end module, and the communication apparatus according to preferred embodiments of the present invention have been described with reference to the first to fifth preferred embodiments, the present invention is not limited to the above-described preferred embodiments. The present invention includes other preferred embodiments provided by combining arbitrary elements in the above-described preferred embodiments, or a modification obtained by making various changes conceivable to those skilled in the art to the above-described preferred embodiments without departing from the gist of the present invention.

For example, although the filter unit 30 and the inductors 40 are provided on the first main side (such as the front surface) of the substrate 20 in the above-described preferred embodiments, the filter unit 30 and the inductors 40 may be provided inside the substrate 20.

In addition, for example, the number of switches included in each of the first switch unit 11, the second switch unit 12, and the third switch unit 13, the number of amplifier circuits included in the amplifier 14, the number of filters included in the filter unit 30, and the number of inductors 40, which are illustrated in FIG. 1, are only exemplary, and are not restricted to these numbers.

In addition, although the front-end module includes the inductors 40 in the above-described preferred embodiments, it is not necessary for the front-end module to include the inductors 40.

Preferred embodiments of the present invention may be widely used as a front-end module and a communication apparatus applicable to a multiband system in communication devices such as cellular phones.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An integrated circuit comprising:
   a first switch;
   a second switch; and
   an amplifier electrically connected between the first switch and the second switch; wherein
   an RF signal path passes through first switch, the amplifier, and the second switch in this order; and
   the integrated circuit includes:
      at least one input terminal and at least one output terminal that are to be connected to each other outside of the integrated circuit between the first switch and the amplifier with a component disposed outside of the integrated circuit and connected between the first switch and the amplifier, or
      at least one input terminal and at least one output terminal that are to be connected to each other outside of the integrated circuit between the amplifier and the second switch with a component disposed outside of the integrated circuit and connected between the amplifier and the second switch; and
   in a top view of the integrated circuit, a first region of the first switch, a second region of the amplifier, and a third region of the second switch are disposed on a straight line such that a virtual straight line connects any point of the first region, any point of the second region, and any point of the second region in this order.

2. The integrated circuit according to claim 1, wherein in the top view of the integrated circuit, the second region is between or substantially between the first region and the third region.

3. The integrated circuit according to claim 2, wherein in the top view of the integrated circuit, the first switch and the amplifier, or the amplifier and the second switch, are disposed next to each other.

4. The integrated circuit according to claim 3, wherein in the top view of the integrated circuit, the amplifier and the second switch are disposed next to each other.

5. The integrated circuit according to claim 4, wherein the amplifier is a low-noise amplifier;
   the at least one input terminal and the at least one output terminal that are to be connected to each other outside of the integrated circuit provides a connection between the first switch and the amplifier outside of the integrated circuit; and
   the component to be connected between the first switch and the amplifier is a reception filter.

6. The integrated circuit according to claim 5, wherein in the top view of the integrated circuit, the integrated circuit has a rectangular or substantially rectangular shape and the virtual straight line is parallel or substantially parallel to a side of the rectangular or substantially rectangular shape.

7. The integrated circuit according to claim 1, wherein in the top view of the integrated circuit, the first switch and the amplifier, or the amplifier and the second switch, are disposed next to each other.

8. The integrated circuit according to claim 7, wherein in the top view of the integrated circuit, the amplifier and the second switch are disposed next to each other.

9. The integrated circuit according to claim 8, wherein the amplifier is a low-noise amplifier;
   the at least one input terminal and the at least one output terminal that are to be connected to each other outside of the integrated circuit provides a connection between the first switch and the amplifier outside of the integrated circuit; and
   the component to be connected between the first switch and the amplifier is a reception filter.

10. The integrated circuit according to claim 9, wherein in the top view of the integrated circuit, the integrated circuit has a rectangular or substantially rectangular shape and the virtual straight line is parallel or substantially parallel to a side of the rectangular or substantially rectangular shape.

11. A front-end module comprising:
    a first switch;
    a second switch;
    an amplifier electrically connected between the first switch and the second switch;
    a component connected between the first switch and the amplifier, or between the amplifier and the second switch; and
    a substrate; wherein
    the first switch, the amplifier, and the second switch are included in an integrated circuit;
    the integrated circuit is disposed on the substrate;
    the component is disposed on the substrate and outside of the integrated circuit;
    an RF signal path passes through the first switch, the amplifier, and the second switch in this order; and in a top view of the integrated circuit, a first region of the first switch, a second region of the amplifier, and a third region of the second switch are disposed on a straight line such that a virtual straight line connects any point of the first region, any point of the second region, and any point of the second region in this order.

12. The front-end module according to claim 11, wherein in the top view of the integrated circuit, the second region is between or substantially between the first region and the third region.

13. The front-end module according to claim 12, wherein in the top view of the integrated circuit, the first switch and the amplifier, or the amplifier and the second switch, are disposed next to each other.

14. The front-end module according to claim 13, wherein in the top view of the integrated circuit, the amplifier and the second switch are disposed next to each other.

15. The front-end module according to claim 14, wherein the amplifier is a low-noise amplifier;

the component is a reception filter; and the component is connected between the first switch and the amplifier.

16. The front-end module according to claim 15, wherein in the top view of the integrated circuit, the integrated circuit has a rectangular or substantially rectangular shape and the virtual straight line is parallel or substantially parallel to a side of the rectangular or substantially rectangular shape.

17. The front-end module according to claim 11, wherein in the top view of the integrated circuit, the first switch and the amplifier, or the amplifier and the second switch, are disposed next to each other.

18. The front-end module according to claim 17, wherein in the top view of the integrated circuit, the amplifier and the second switch are disposed next to each other.

19. The front-end module according to claim 18, wherein the amplifier is a low-noise amplifier;

the component is a reception filter; and the component is connected between the first switch and the amplifier.

20. The front-end module according to claim 19, wherein in the top view of the integrated circuit, the integrated circuit has a rectangular or substantially rectangular shape and the virtual straight line is parallel or substantially parallel to a side of the rectangular or substantially rectangular shape.

\* \* \* \* \*